(12) United States Patent
Nereau et al.

(10) Patent No.: US 11,017,971 B2
(45) Date of Patent: May 25, 2021

(54) DIFFERENTIAL ELECTRICAL PROTECTION DEVICE THAT MEASURES A DIFFERENTIAL CURRENT OVER A PLURALITY OF PHASE CONDUCTORS

(71) Applicants: Schneider Electric Industries SAS, Rueil-Malmaison (FR); Fuji Electric FA Components & Systems Co., Ltd, Chuo-ku (JP)

(72) Inventors: Jean-Pierre Nereau, Seyssinet (FR); Yutaka Sato, Chuo-ku (JP); Takashi Hashimoto, Chuo-ku (JP); Yohei Hosooka, Chuo-ku (JP)

(73) Assignees: Schneider Electric Industries SAS, Rueil-Malmaison (FR); Fuji Electric FA Components & Systems Co., Ltd, Chuo-ku (JP)

( * ) Notice: Subject to any disclaimer, the term of this patent is extended or adjusted under 35 U.S.C. 154(b) by 217 days.

(21) Appl. No.: 16/038,213

(22) Filed: Jul. 18, 2018

(65) Prior Publication Data

US 2019/0035590 A1 Jan. 31, 2019

(30) Foreign Application Priority Data

Jul. 25, 2017 (FR) ..................................... 17 57064

(51) Int. Cl.
*H01H 83/22* (2006.01)
*H01H 83/14* (2006.01)
(Continued)

(52) U.S. Cl.
CPC ......... *H01H 83/226* (2013.01); *G01R 15/181* (2013.01); *H01F 27/36* (2013.01);
(Continued)

(58) Field of Classification Search
CPC . H02M 7/2176; H02M 7/217; H01L 27/0629; H01L 29/7786; H01L 27/0605; H02H 7/267; H02H 7/12; H05K 5/0247
See application file for complete search history.

(56) References Cited

U.S. PATENT DOCUMENTS

| 6,710,587 B1* | 3/2004 | Reynoso | G01R 15/205 324/117 H |
|---|---|---|---|
| 2003/0030528 A1* | 2/2003 | Attarian | H01H 71/125 336/175 |

(Continued)

FOREIGN PATENT DOCUMENTS

| DE | 297 24 317 U1 | 9/2000 |
|---|---|---|
| EP | 0 903 765 A2 | 3/1999 |
| EP | 1 736 784 A1 | 12/2006 |

OTHER PUBLICATIONS

French Preliminary Search Report dated Mar. 19, 2018 in French Application 17 57064, filed on Jul. 25, 2017 ( with English Translation of Categories of Cited Documents and Written Opinion).

*Primary Examiner* — Kyle J Moody
*Assistant Examiner* — Lakaisha Jackson
(74) *Attorney, Agent, or Firm* — Oblon, McClelland, Maier & Neustadt, L.L.P.

(57) ABSTRACT

A differential electrical protection device D including N–1 phase conductors, each phase conductor including, between an input, or upper, connection land and an output, or lower, connection land, a portion able to pass through a torus and a portion able to pass through a current measurement and supply sensor, the input connection lands being situated in a first plane P1, and the output connection lands extending in a second plane P2, in that the supply and measurement sensors of the N–1 phase conductors are each positioned in the space situated between the two planes P1,P2, and (Continued)

Figure 1:
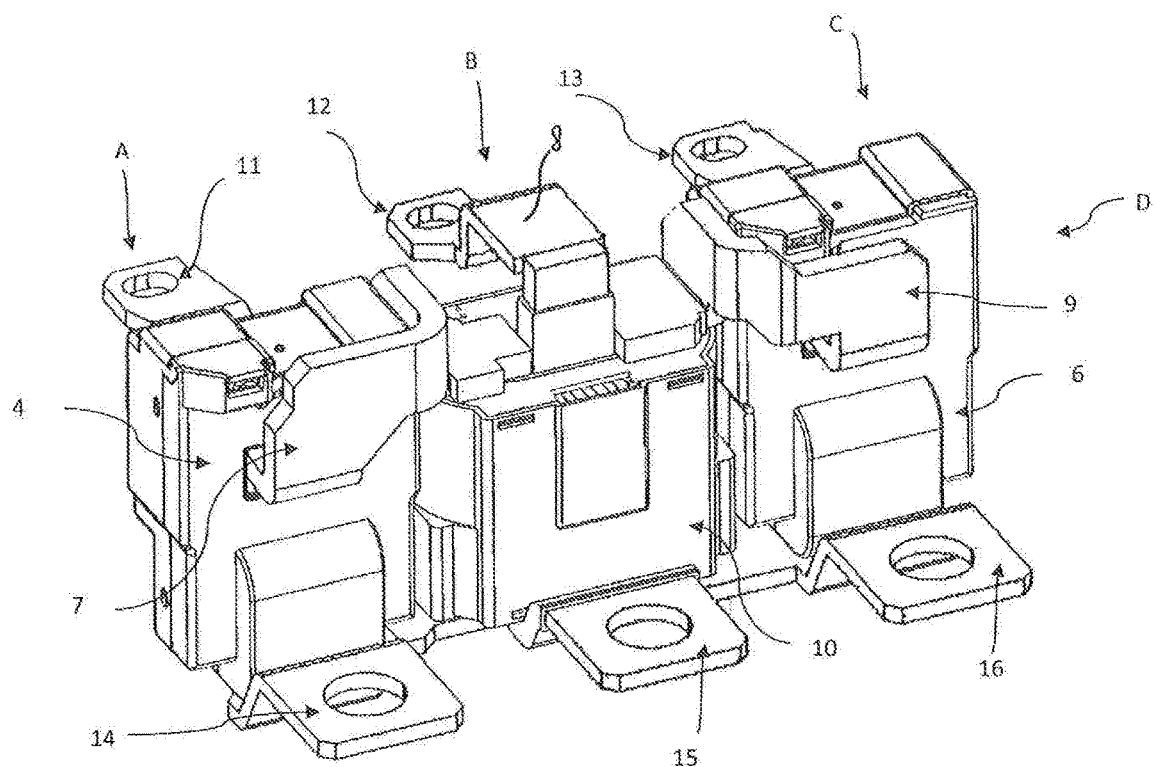

wherein it includes an additional phase conductor including an input connection land and an output connection land, a portion able to pass through the torus and a portion able to pass through an additional measurement sensor only measuring the current, this additional measurement sensor being of small size and being positioned directly above the torus in such a way that the assembly formed by the torus and the additional sensor is situated substantially in the space between the two planes P1,P2.

11 Claims, 10 Drawing Sheets

(51) Int. Cl.
*H01F 27/36* (2006.01)
*G01R 15/18* (2006.01)
*H01F 38/30* (2006.01)
*H01H 71/02* (2006.01)
*G01R 31/50* (2020.01)

(52) U.S. Cl.
CPC ......... *H01F 38/30* (2013.01); *H01H 71/0207* (2013.01); *H01H 83/144* (2013.01); *G01R 31/50* (2020.01); *H01H 2083/148* (2013.01)

(56) References Cited

U.S. PATENT DOCUMENTS

| | | |
|---|---|---|
| 2006/0290454 A1 | 12/2006 | Mas et al. |
| 2019/0041461 A1* | 2/2019 | Reid .................. G01R 31/3277 |
| 2019/0052072 A1* | 2/2019 | Gass .................. H02H 1/0015 |

* cited by examiner

DIFFERENTIAL ELECTRICAL PROTECTION DEVICE THAT MEASURES A DIFFERENTIAL CURRENT OVER A PLURALITY OF PHASE CONDUCTORS

TECHNICAL FIELD

The present invention relates to differential circuit breakers, and specifically to circuit breakers in which the differential function is integrated into the function for protecting against short circuits, in particular to circuit breakers including an electronic trip unit.

Prior Art

Differential electrical protection devices are known that are intended to protect at least N electrical lines and include a switching device and a trip module, the latter being intended to be connected to the switching device, said trip module including firstly a device for measuring the differential current in at least two current lines, this device for measuring the differential current including a magnetic circuit intended to surround so-called primary conductors that are respectively associated with the aforementioned current lines, forming a primary circuit of a transformer, and a secondary winding wound around the magnetic circuit and forming the secondary circuit of the transformer, and secondly current measurement sensors for each current line, respectively, said switching device including power supply means, processing means connected electrically upstream to the device for measuring the differential current and to the various current measurement sensors, and downstream to a device for actuating a mechanism for opening the contacts.

The main difficulty that needs to be solved, to house the differential protection function inside the electronic unit, is the lack of space for housing the measurement torus that is imperative for performing the differential protection function.

It is known from patent EP 1045500 that one of the phase sensors, used to protect against short circuits, is able to be removed in order to install the torus. It is also known that such a torus may be accompanied by a current transformer surrounding the three or four primary conductors, so as to supply power to the processing unit in the event that the primary conductor, which is not equipped with a phase sensor, exhibits a ground fault.

Now, it is possible to remove such a phase sensor if it is able to be ensured that the sum of the currents in the primary conductors is equal to zero. In this case, the current originating from the missing sensor may be considered to be equal to the sum of the currents originating from the other sensors.

However, this assumption holds true only if the differential function ensures tripping of the circuit breaker that is fast enough to provide an adequate response in the event of a short circuit. Now, it is common for the tripping of the differential protection to be able to be delayed, at the user's behest, by one second or more.

Furthermore, there are variants of such differential circuit breakers in which the differential function is used only to raise an alarm, and does not lead to the circuit breaker actually tripping.

DISCLOSURE OF THE INVENTION

The present invention solves these problems and proposes a differential electrical protection device that makes it possible to actually measure the current in all of the primary conductors, without reducing the space available for the torus.

To this end, the subject of the present invention is a differential electrical protection device of the kind mentioned above, this device being characterized in that it includes N−1 phase conductors, each phase conductor including, between a so-called input, or upper, connection land and a so-called output, or lower, connection land, a portion able to pass through the aforementioned torus and a portion able to pass through a current measurement and power supply sensor, the so-called input connection lands being situated in a so-called first plane, and the so-called output connection lands extending in a so-called second plane, in that the aforementioned power supply and measurement sensors of the N−1 phase conductors are each positioned in the space situated between the two aforementioned planes, and in that the device furthermore includes a so-called additional phase conductor including a so-called input connection land and a so-called output connection land, a portion able to pass through the aforementioned torus and a portion able to pass through a so-called additional measurement sensor only measuring the current, this so-called additional measurement sensor being of small size and being positioned directly above the torus in such a way that the assembly formed by the torus and the additional sensor is situated substantially in the space between the two aforementioned planes.

According to one particular feature, the aforementioned measurement sensor is a Rogowski sensor.

According to another feature, the aforementioned torus is associated with a current transformer surrounding the phase conductors, so as to supply power to the processing means in the presence of a ground fault on the so-called additional phase conductor.

According to one particular feature, each main phase conductor includes a so-called first main part intended to pass through the torus and, at each of its two ends, a connecting portion extending substantially perpendicular to the main part, the two connecting portions of each phase conductor extending in two opposite directions, respectively.

According to one particular embodiment, the so-called additional measurement sensor is shaped in such a way that its axis extends substantially parallel to the axis of the torus.

According to another embodiment, the so-called additional phase conductor is shaped in such a way that its axis extends substantially perpendicular to the axis of the torus.

According to another feature, the two connection lands of one and the same phase conductor extend substantially parallel with respect to one another.

According to another feature, the or each of the N−1 phase conductors has initially been bent twice at a right angle so as to enable it to be inserted into the aperture of the torus, after which said conductor has again been bent twice at a right angle so as to be inserted into the measurement and power supply sensor associated with said conductor, while the additional phase conductor passes successively and directly through the torus and then the additional measurement sensor without bending.

According to one particular embodiment, N is equal to three, the device being of three-pole type.

According to another embodiment, N is equal to four, the device being of four-pole type.

According to one particular feature, this device is a circuit breaker.

Figure 2:
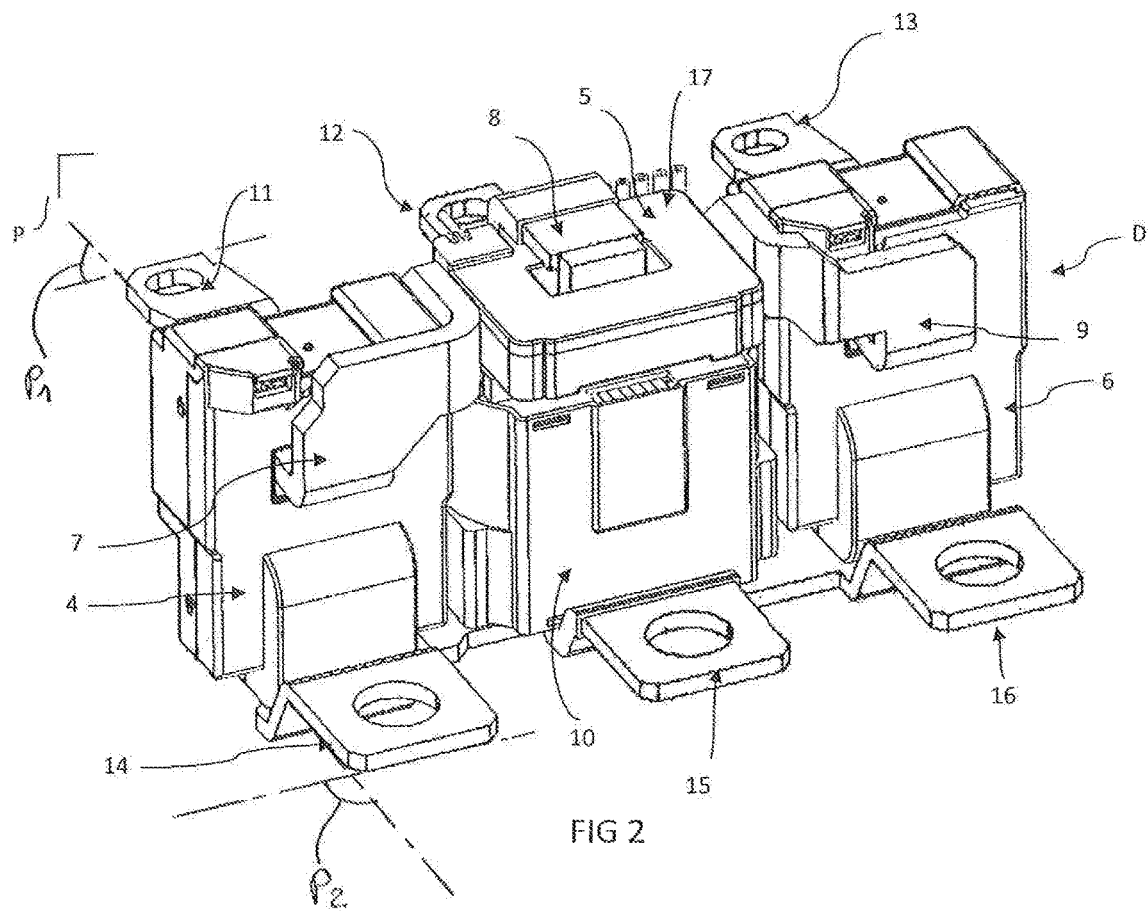
Figure 3:
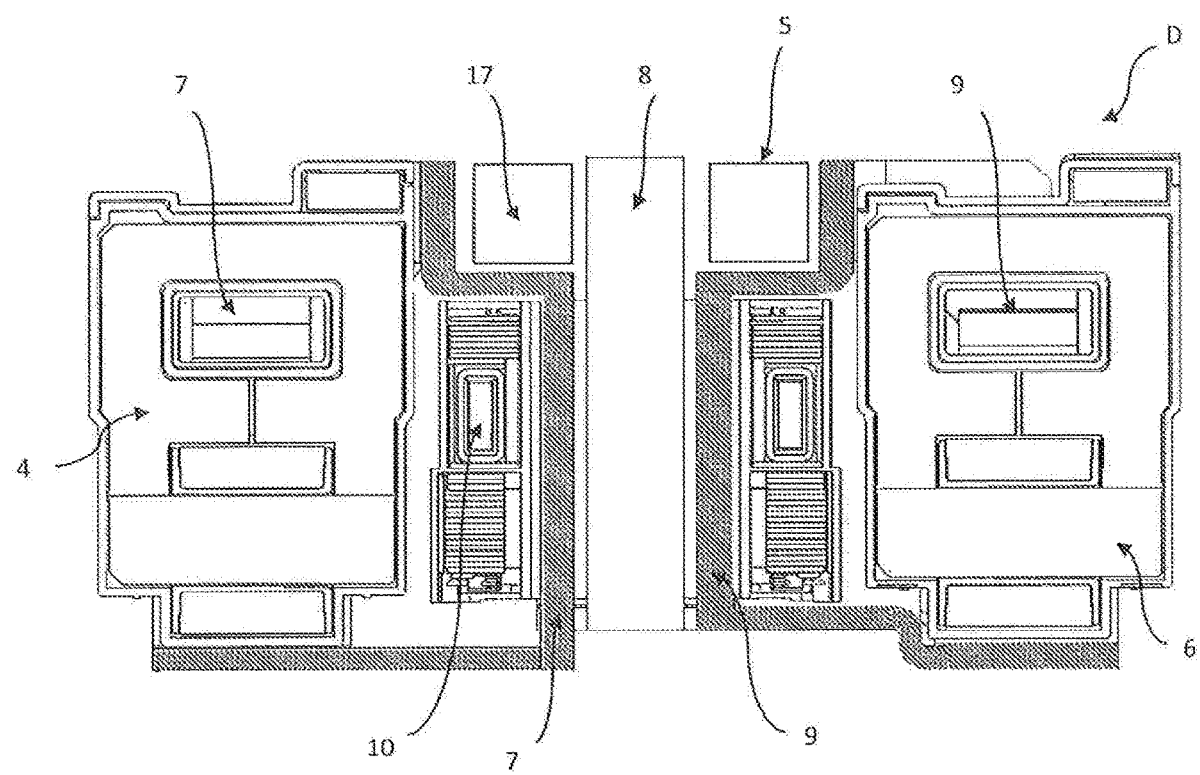
Figure 4:
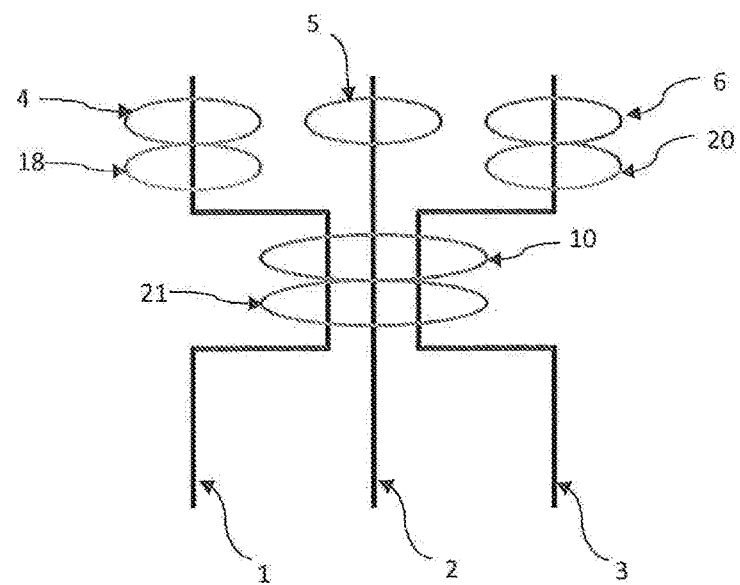
Figure 5:
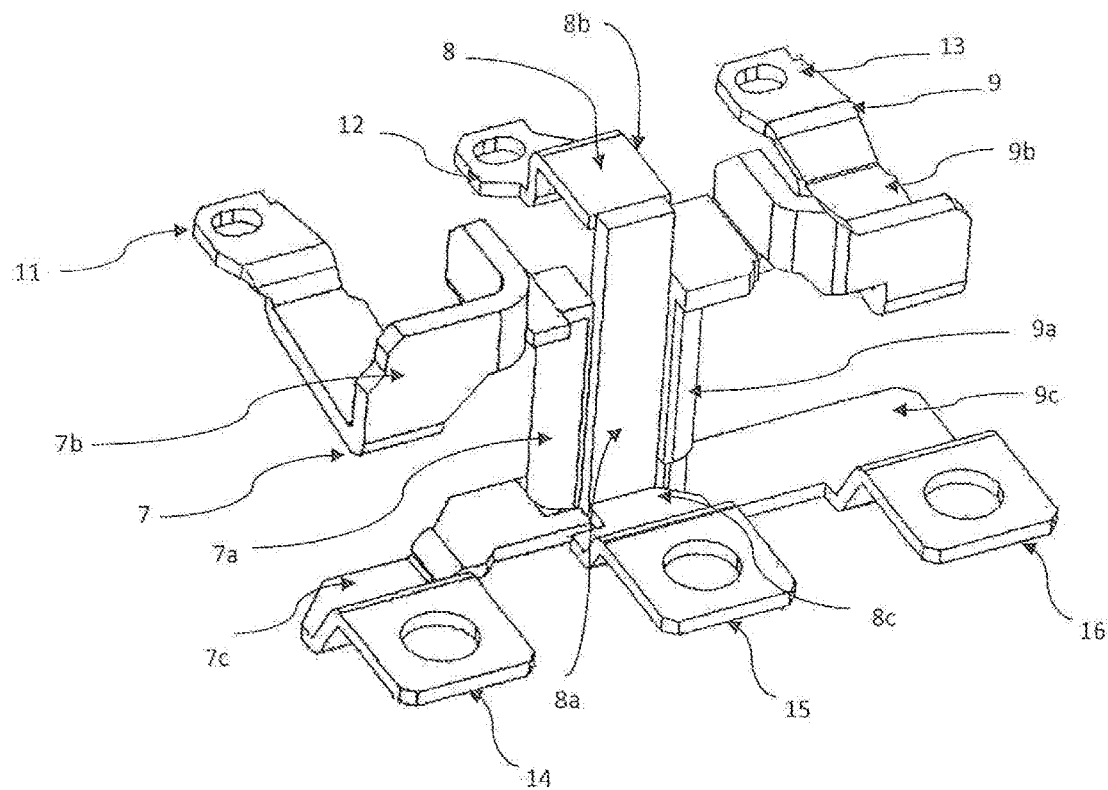
Figure 6:
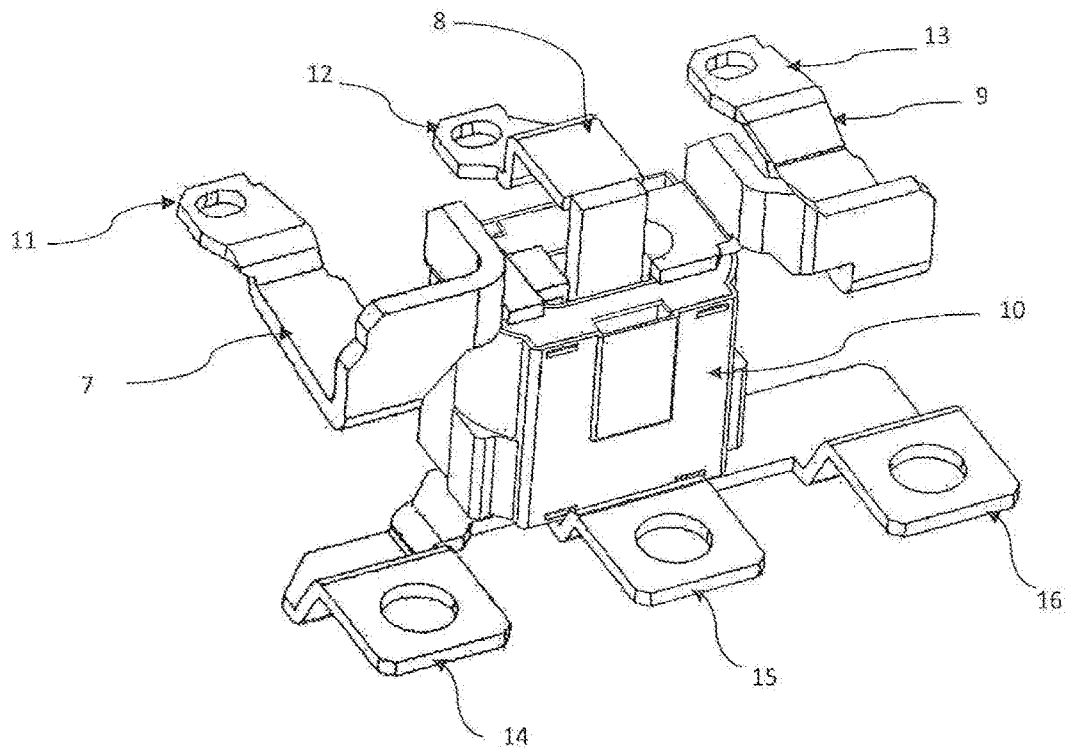
Figure 7:
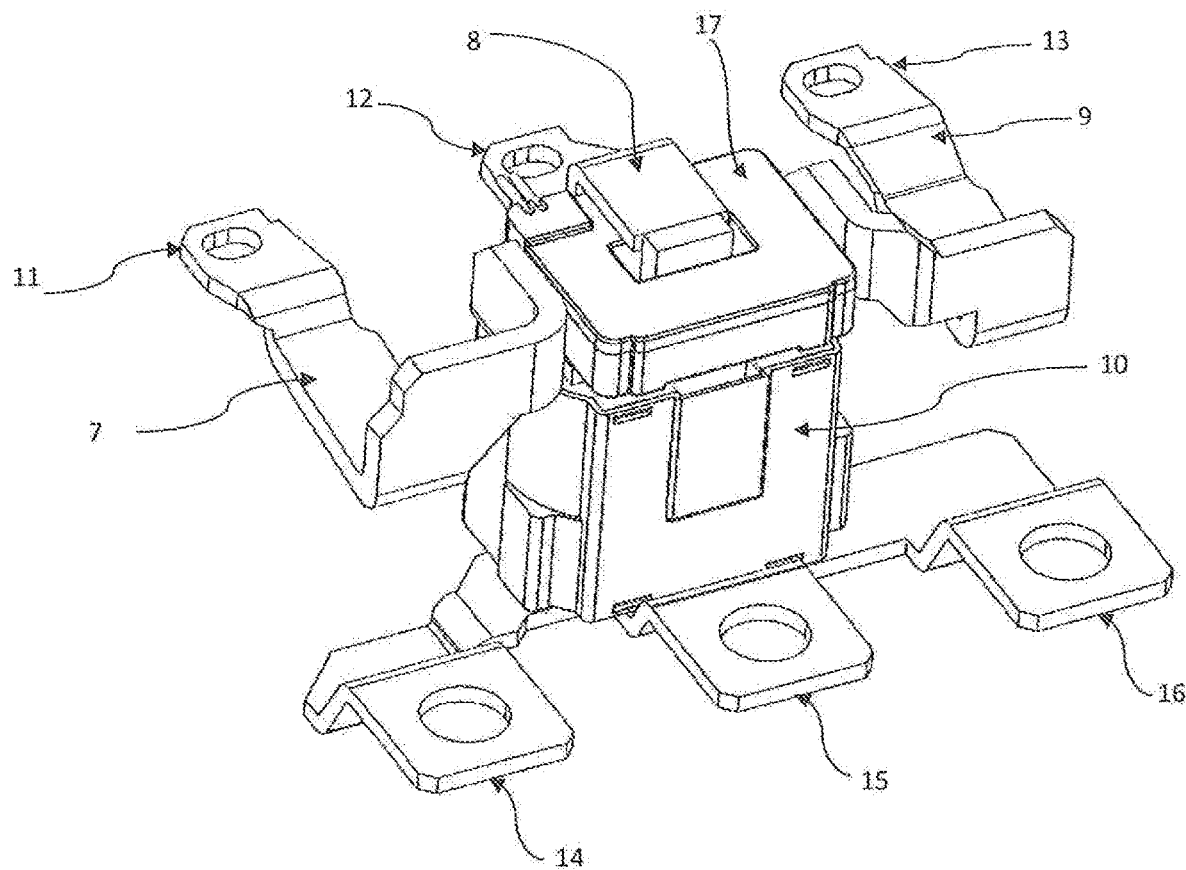
Figure 8:
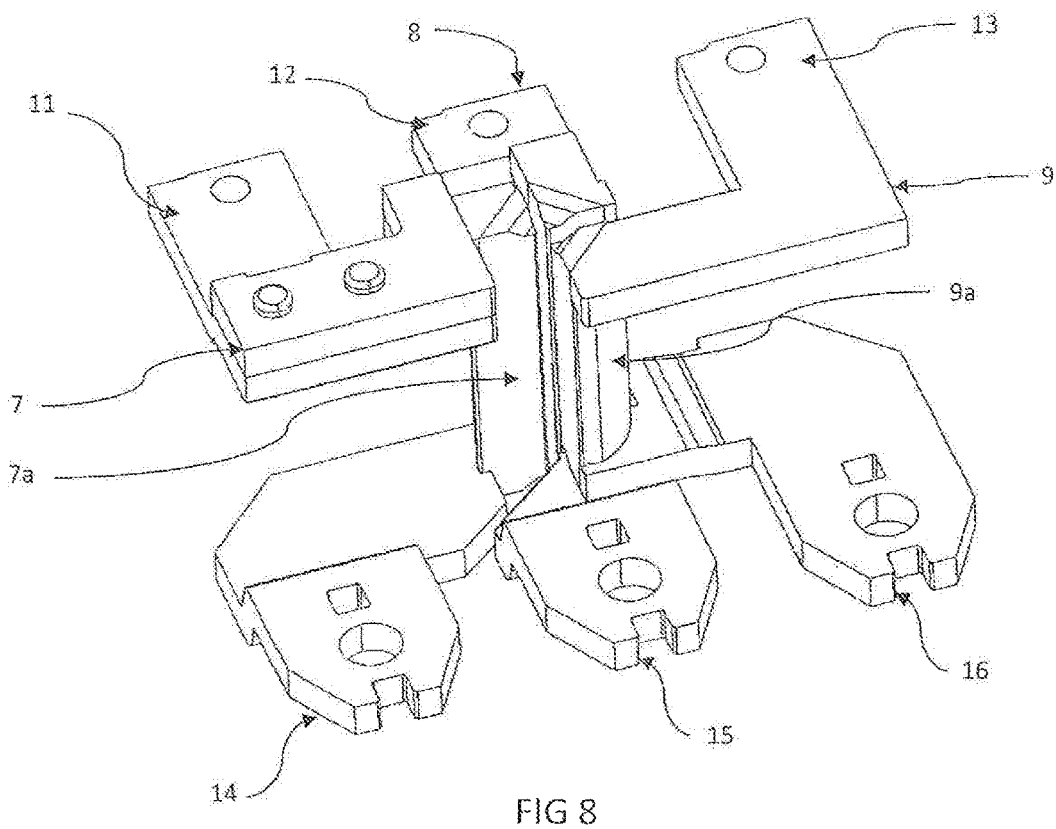
Figure 9:
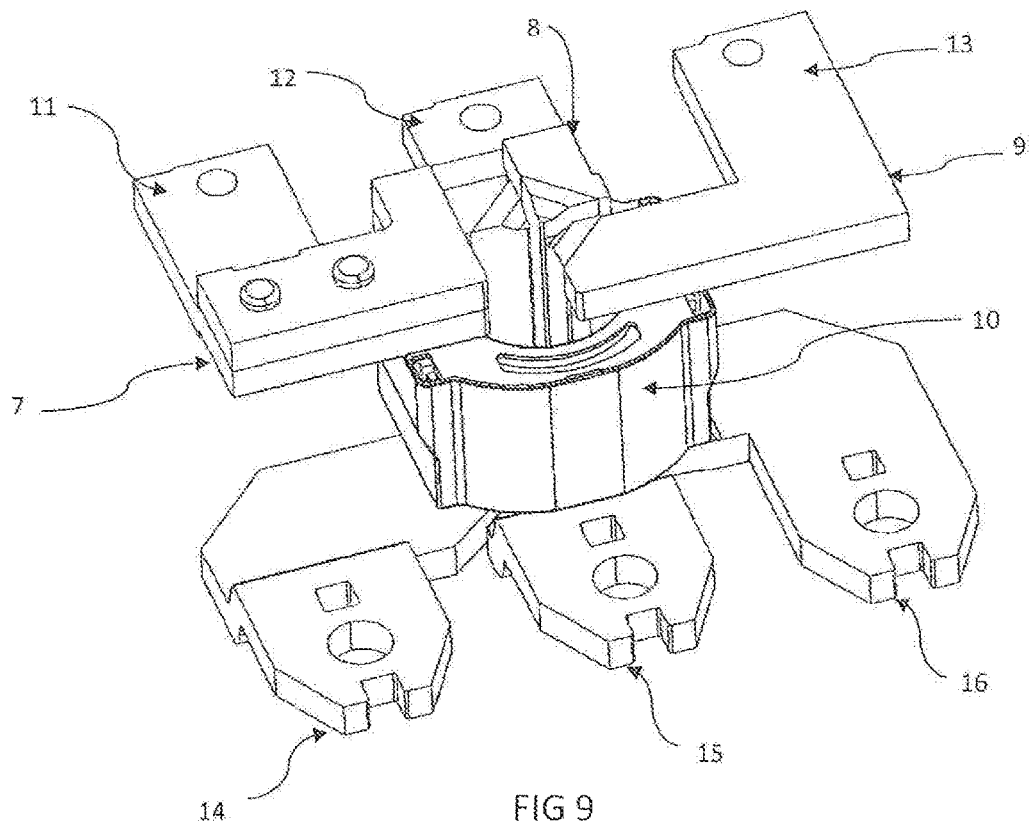
Figure 10:
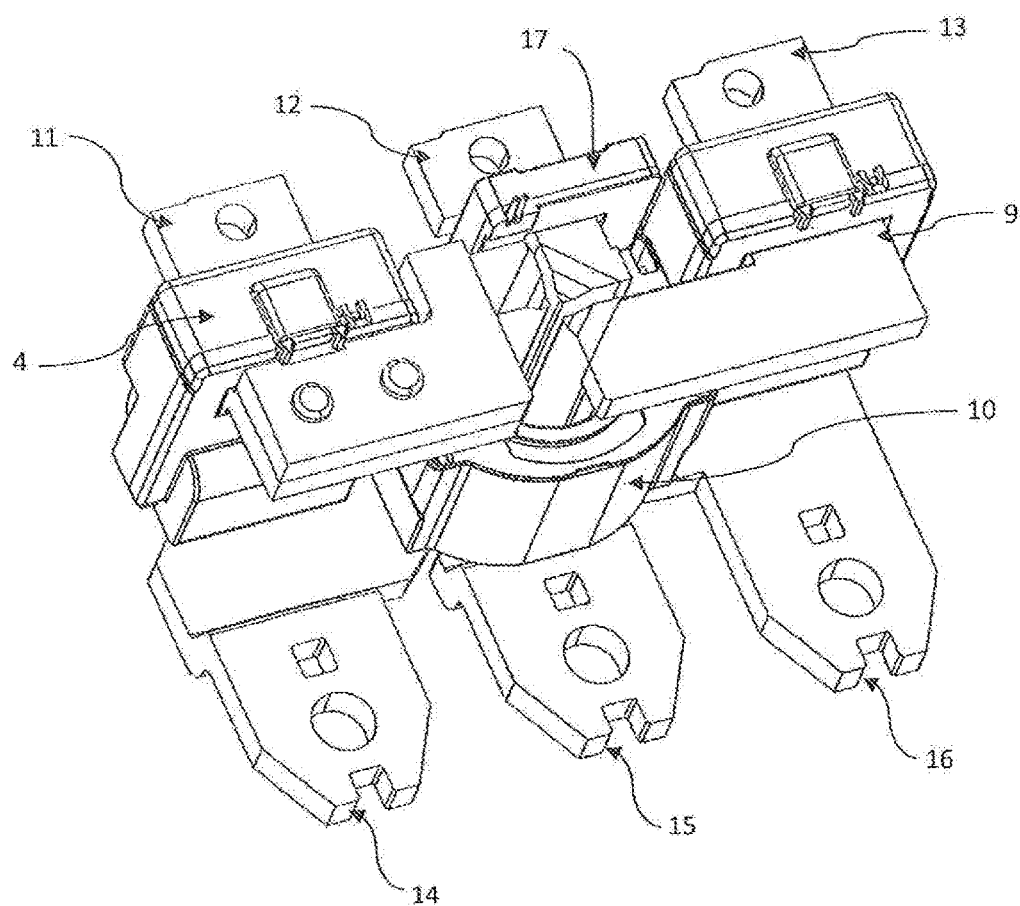
Figure 11:
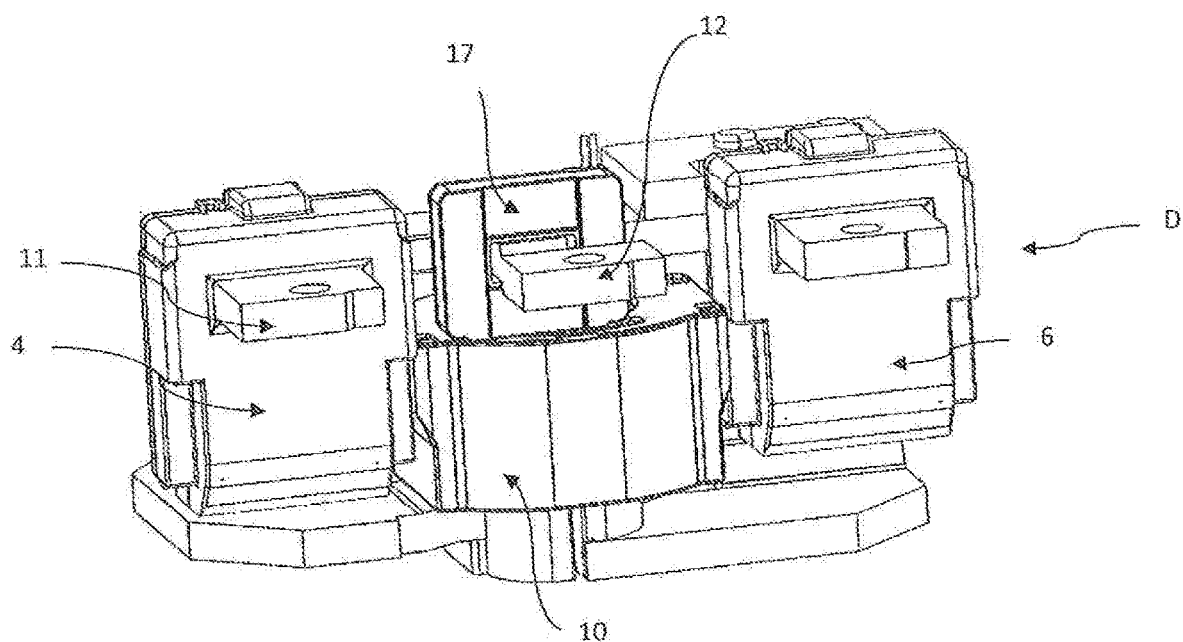
Figure 12:
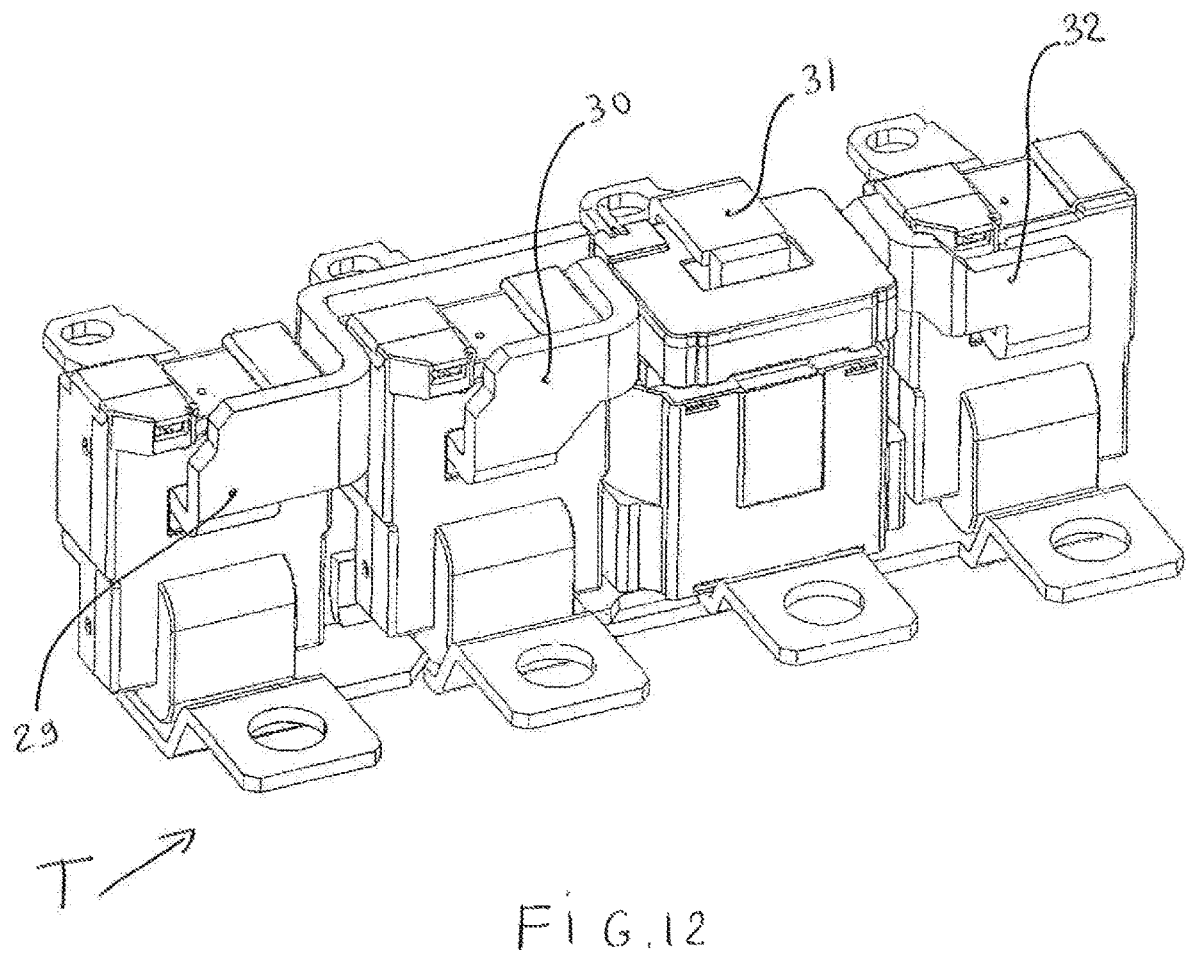
Figure 13:
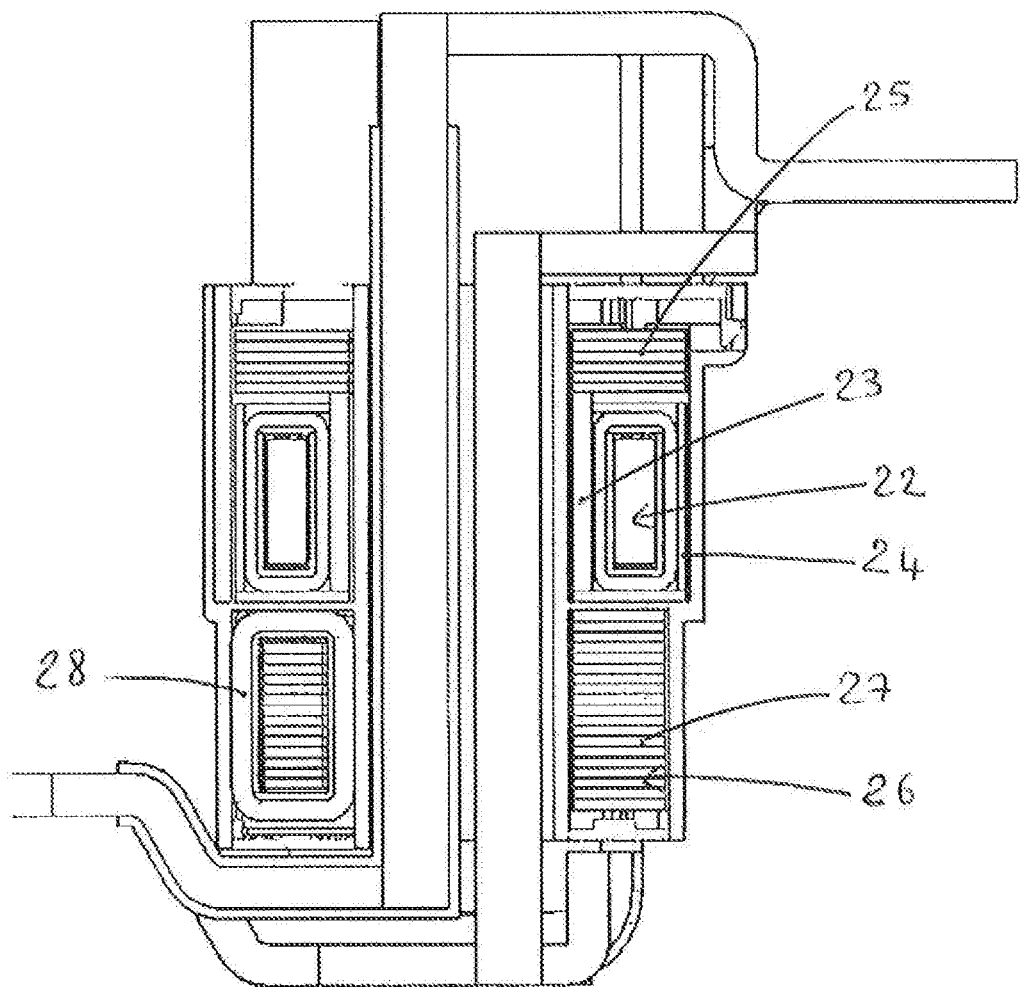
Figure 14:
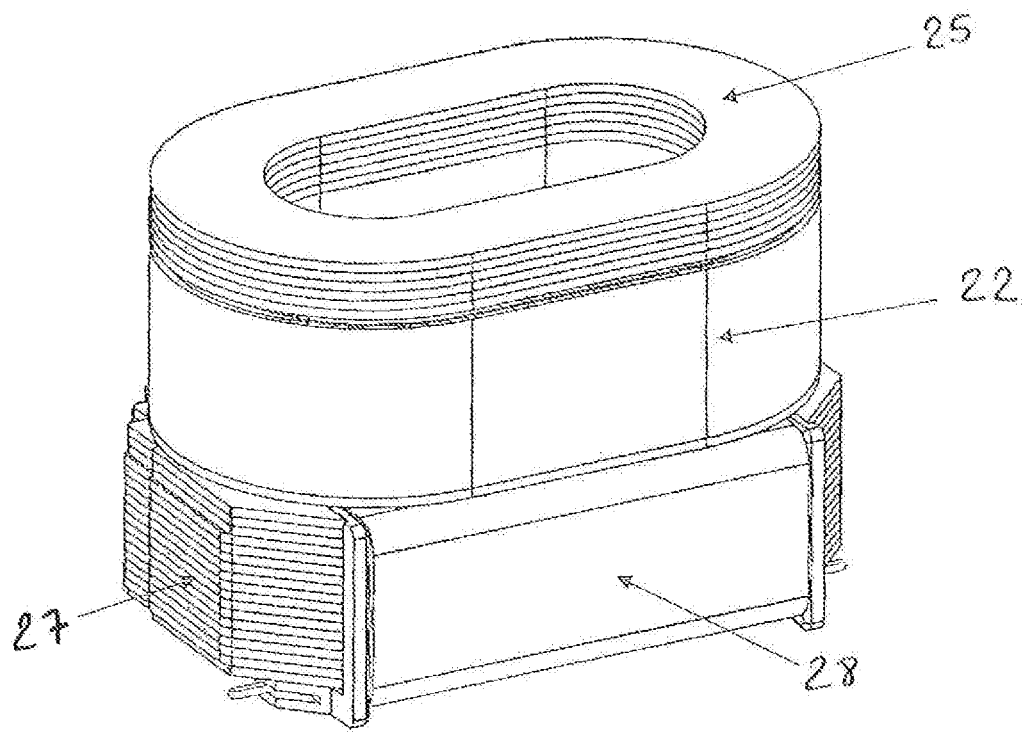
Figure 15:
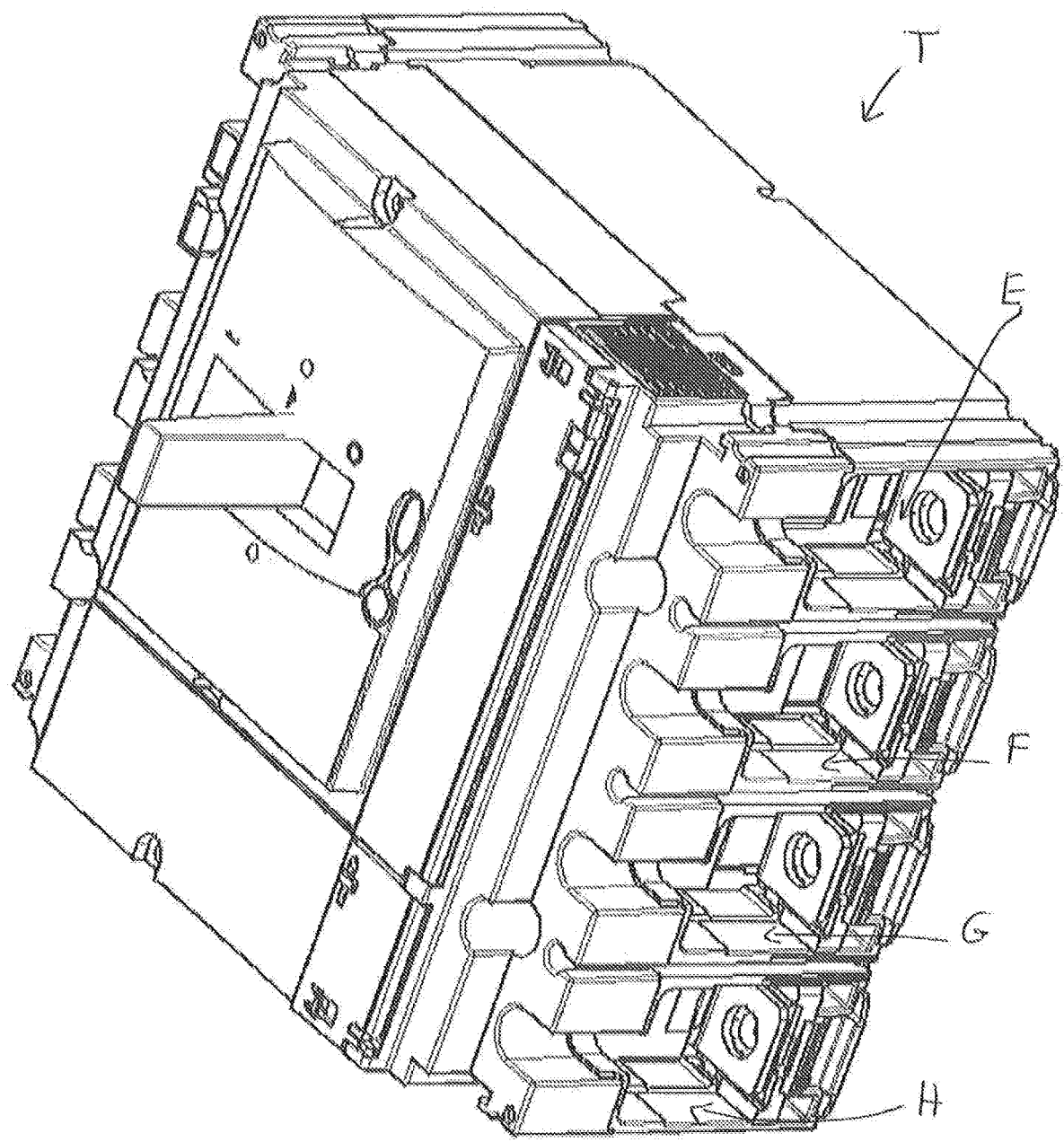

However, other advantages and features of the invention will become more clearly apparent in the detailed description that follows with reference to the appended drawings, which are given solely by way of example and in which:

FIGS. 1 to 7 illustrate a first embodiment of the invention,

FIG. 1 is a perspective view illustrating a differential electrical protection device according to the invention without the sensor of the central phase, FIG. 2 is a perspective view illustrating a differential electrical protection device according to the invention with the sensor of the central phase, FIG. 3 is a sectional view along a plane P of FIG. 2, FIG. 4 is a schematic depiction, illustrating the various elements forming the differential electrical protection device according to the invention and their arrangement in relation to one another, FIG. 5 is a perspective view illustrating the primary conductors without the sensors, FIG. 6 is a perspective view illustrating the primary conductors with the so-called torus summer sensor, FIG. 7 is a perspective view illustrating the primary conductors with the summer sensor and the central phase sensor, FIGS. 8 to 11 illustrate a second embodiment of the invention, FIG. 8 is a perspective view illustrating the primary conductors without the phase sensors and without the summer sensor, FIG. 9 is a perspective view illustrating the primary conductors without the phase sensors and with the summer sensor, FIG. 10 is a perspective view illustrating the primary conductors with the phase sensors and the summer sensor, and FIG. 11 is a perspective view of the same assembly as in the previous figure, but seen from the other side, FIG. 12 is a perspective view partly illustrating the inner part of a differential four-pole circuit breaker according to the invention, FIG. 13 is an axial sectional view of the summer and of its associated power supply sensor, according to the invention, FIG. 14 is a perspective view of this same assembly, and FIG. 15 is a perspective view illustrating the aforementioned differential four-pole circuit breaker in its entirety.

In the figures, what is seen is a differential electrical protection device D intended for the electrical protection of three electrical lines 1,2,3 and primarily including, in a manner known per se, a switching device and a trip module intended to be connected to the switching device. This trip module firstly includes a device for measuring the differential current in at least two current lines, and current measurement and power supply sensors respectively associated with each current line. As illustrated in the figures, each measurement and power supply sensor 4,6 is mounted around a phase conductor 7,9 that is associated with said current line.

This device for measuring the differential current includes a magnetic circuit 10 intended to surround the primary conductors that are respectively associated with the aforementioned current lines, this magnetic circuit forming the primary circuit of a transformer, and a secondary winding wound around the magnetic circuit and forming the secondary circuit of the transformer.

This switching device includes power supply means, processing means connected electrically upstream to the device for measuring the differential current and to the various current measurement and power supply sensors, and downstream to a device for actuating a mechanism for opening the contacts.

As illustrated in FIGS. 1,2, each differential electrical protection device D includes three parts A, B, C, corresponding to the various phases of the device, respectively.

Each phase conductor 7, 8, 9 includes a main part 7a, 8a, 9a including, at each of its two opposite ends, a connecting part 7b,7c,8b,8c,9b,9c extending substantially perpendicular to the main part, but in two opposite directions for these two portions.

These connecting parts include, at their free ends, so-called input connection lands 11,12,13 and so-called output connection lands 14,15,16. The so-called input connection lands 11,12,13 are arranged in a so-called first plane P1, while the so-called output connection lands 14,15,16 are arranged in a so-called second plane P2.

The three phase conductors are arranged side by side such that their main parts are joined together so as to enable them to pass through the aperture of the torus 10 of the transformer.

According to the invention, each of the two end phase conductors 7,9 bears a measurement and power supply sensor 4,6 mounted around one 7b, 9b of the aforementioned connecting parts, the two parts bearing these sensors being situated on the same side of the device.

For each end phase conductor 7,9, the measurement and power supply sensor is housed in the space substantially between the two planes P1, P2.

For the purpose of optimizing the space inside the electrical protection device, the part situated between the two aforementioned planes P1, P2 level with the central conductor is intended to house the torus 10 of the magnetic circuit, and is therefore not able to receive a measurement sensor of the type used for the two end conductors 7,9. Specifically, for these two end conductors 7,9, the measurement sensors are so-called measurement and power supply sensors, as they are also able to be connected to the aforementioned power supply means so as to provide the supply of power to the processing means. Thus, by virtue of this type of sensor, the supply of electric power to the processing means associated with the differential measurement device is able to be achieved without an auxiliary electric power supply. It will be noted that the measurement and power supply functions may be performed by one sensor performing the measurement and another sensor supplying power 18,19.

According to the invention, in order to make it possible to measure the current flowing both in the central main conductor 8 and the housing of the torus 10, a simple so-called additional current measurement sensor 17, that is to say that is not able to perform the aforementioned electric power supply function, is placed around a connecting part 8b of the central main conductor 8, this additional measurement sensor 17 being arranged above the torus 10. The central conductor 8 is shaped by suitable bending of the material of which it is formed, such that the assembly formed by the torus 10 and the additional central measurement sensor 17 is situated substantially in the space between the two aforementioned planes.

According to the first embodiment illustrated in FIGS. 1 to 7, it is seen that the so-called additional central measurement sensor 17 is arranged in such a way that its axis is parallel to and advantageously even coincident with the axis of the torus 10 of the magnetic circuit. According to the second embodiment illustrated in FIGS. 8 to 11, this central phase sensor 17 is arranged in such a way that its axis extends substantially perpendicular to the axis of the torus 10. According to the invention, the current flowing in the line that usually does not have a sensor is measured using an additional sensor of small size, preferably a Rogowski sensor, for measurement only, that is positioned above the torus.

As illustrated more particularly in FIG. 4, according to the invention, all of the primary conductors pass through the torus. Only the conductor of the central pole passes directly through the additional sensor without bending, while the other conductors are curved in such a way as to move away from the additional sensor and to be directed to their respective pole positions.

In FIG. 4, it is also seen that the connection lands 11,12,13 of the conductors 7,8,9 situated on one side of the torus are spaced apart with respect to one another by a spacing corresponding to the one separating the connection lands 14,15,16 of the conductors 7,8,9 situated on the side of the torus opposite the previous one. Between the connection lands 11,13 situated at the so-called lower part of the torus 10 and the ones 14,16 situated at the upper part of the torus, the end conductors 7,9 are bent twice at 90° so as to be able to pass through the measurement torus, and then twice again at a right angle so as to pass through a power supply and measurement sensor 4,6, while the central conductor 8 passes directly through the torus 10 and then the so-called central measurement sensor 5 without bending.

By using a Rogowski sensor, the size of the additional sensor is very small, enabling it to adapt to the very limited available space, and the current is able to be measured up to short-circuit current levels.

In the embodiments illustrated in FIGS. 8 to 11, this additional sensor is positioned level with the so-called upper part of the torus.

According to another embodiment, not illustrated, this sensor could be situated level with the lower part of the torus, that is to say on the side of the connection lands 14,15,16 opposite those 11,12,13 situated at the upper part of the torus 10.

As illustrated in FIGS. 13 and 14, the summer torus 22 has an outer shield 24, an inner shield 23 and an upper shield 25. This assembly is positioned above a power supply torus 26 including a coil 28 and a magnetic circuit 27 also serving as a lower shield.

It will be noted that, advantageously, the aforementioned torus 10 may be associated with a current transformer 21 surrounding the phase conductors, so as to supply power to the processing means in the presence of a ground fault on the additional phase conductor.

Although FIGS. 1 to 11 illustrate a three-pole differential protection device, the invention may also be applied in a four-pole circuit breaker, as illustrated in FIG. 12, including four modules E, F, G, H, and in which four phase conductors 29 to 32 pass through the summer.

What has therefore been produced, by virtue of the invention, is a differential electrical protection device with a simple design that makes it possible to actually measure the current in all of the primary conductors without reducing the space available for the torus in order to do this.

Of course, the invention is not limited to the embodiments described and illustrated, which have been given only by way of example.

On the contrary, the invention comprises all of the technical equivalents of the means described and combinations thereof provided that these are implemented in accordance with its spirit.

The invention claimed is:

1. A differential electrical protection device intended to protect at least N electrical lines and including a switching device and a trip module intended to be connected to the switching device, said trip module including firstly a device for measuring a differential current in at least two current lines, this device for measuring the differential current including a magnetic circuit including a torus intended to surround primary conductors that are respectively associated with the at least two current lines, and secondly current measurement and power supply sensors for each of the at least two current lines, respectively, said switching device including a power supply and a processor connected electrically upstream to the differential electrical protection device that is configured to measure the differential current and to the various current measurement and power supply sensors, and downstream to an actuator that opens contacts, wherein the differential electrical protection device includes N−1 phase conductors, each of the N−1 phase conductors being one of the primary conductors and including, between an input connection land and an output connection land, a portion able to pass through the torus and a portion able to pass through one of the current measurement and power supply sensors, the input connection lands being situated in a first plane P1, and the output connection lands extending in a second plane P2, in that the power supply and measurement sensors of the N−1 phase conductors are each positioned in a space situated between the two planes P1,P2, and in that the differential electrical protection device furthermore includes an additional phase conductor including an input connection land and an output connection land, a portion able to pass through the torus and a portion able to pass through an additional measurement sensor only measuring the differential current, said additional measurement sensor being of small size and being positioned directly above the torus in such a way that an assembly formed by the torus and an additional measurement sensor is situated substantially in the space between the two planes P1,P2.

2. The differential electrical protection device according to claim 1, wherein the additional measurement sensor is a Rogowski sensor.

3. The differential electrical protection device according to claim 1, wherein the torus is associated with a current transformer surrounding the N−1 phase conductors, so as to supply power to the processor in a presence of a ground fault on the additional phase conductor.

4. The differential electrical protection device according to claim 1, wherein each of the N−1 phrase conductors includes a first main part intended to pass through the torus and, at each of two ends of the N−1 phase conductors, a connecting portion extending substantially perpendicular to the first main part, the two connecting portions of each phase conductor extending in two opposite directions, respectively.

5. The differential electrical protection device according to claim 1, wherein the additional measurement sensor is shaped in such a way that an axis of the additional measurement sensor extends substantially parallel to an axis of the torus.

6. The differential electrical protection device according to claim 1, wherein the additional phase sensor is shaped in such a way that an axis of the additional phase sensor extends substantially perpendicular to an axis of the torus.

7. The differential electrical protection device according to claim 1, wherein two connection lands and one and the same phase conductor extend substantially parallel with respect to one another.

8. The differential electrical protection device according to claim 1, wherein each of the N−1 phase conductors has initially been bent twice at a right angle so as to enable said each of the N−1 phase conductors to be inserted into an aperture of the torus, after which said each of the N−1 phase conductors has again been bent twice at a right angle so as to be inserted into the measurement and power supply sensor associated with said each of the N−1 phase conductors, while the additional phase conductor passes successively and directly through the torus and then the additional measurement sensor without bending.

9. The differential electrical protection device according to claim 1, wherein N is equal to three, the differential electrical protection device being of three-pole type.

10. The differential electrical protection device according to claim 1, wherein N is equal to four, the differential electrical protection device being of four-pole type.

11. The differential electrical protection device according to claim 1, wherein the differential electrical protection is a circuit breaker.

* * * * *